United States Patent
Confalonieri et al.

(10) Patent No.: US 7,190,300 B2
(45) Date of Patent: Mar. 13, 2007

(54) SWITCHED CAPACITANCE CIRCUIT AND ANALOG/DIGITAL CONVERTER INCLUDING SAID CIRCUIT

(75) Inventors: Pierangelo Confalonieri, Caponago (IT); Marco Zamprogno, Cesano Maderno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 28 days.

(21) Appl. No.: 11/113,954

(22) Filed: Apr. 25, 2005

(65) Prior Publication Data

US 2005/0258998 A1    Nov. 24, 2005

(51) Int. Cl.
*H03M 1/12* (2006.01)

(52) U.S. Cl. ................................ 341/172; 341/155
(58) Field of Classification Search ............. None
See application file for complete search history.

(56) References Cited

U.S. PATENT DOCUMENTS

| | | | |
|---|---|---|---|
| 4,295,089 A * | 10/1981 | Cooperman | 323/351 |
| 5,847,600 A | 12/1998 | Brooks et al. | 330/9 |
| 6,011,433 A * | 1/2000 | Nairn | 330/2 |
| 6,288,669 B1 | 9/2001 | Gata | 341/172 |
| 2004/0246160 A1 * | 12/2004 | Leung et al. | |

FOREIGN PATENT DOCUMENTS

| EP | 0 689 286 A1 | 12/1995 |
|---|---|---|
| EP | 0 975 092 A2 | 1/2000 |

* cited by examiner

*Primary Examiner*—Jean Bruner Jeanglaude
(74) *Attorney, Agent, or Firm*—Lisa K. Jorgenson; E. Russell Tarleton; Seed IP Law Group PLLC

(57) ABSTRACT

A switched capacitance circuit including: a switched capacitance section, capable of receiving as input a signal and carrying out a sampling of said signal, the section comprising at least one group of capacitors each of which has a terminal connected to a common node; at least an operational stage including at least an input terminal connected to said common node, the operational stage providing a current to said common node for charging said group of capacitors during a sampling time interval of said signal. The circuit further includes an auxiliary circuit connected to said common node and capable of being activated/deactivated by an enabling signal for injecting a further current into said common node and increasing the current provided to said common node during at least one time interval equal to a fraction of said sampling interval.

43 Claims, 3 Drawing Sheets

SWITCHED CAPACITANCE CIRCUIT AND ANALOG/DIGITAL CONVERTER INCLUDING SAID CIRCUIT

BACKGROUND OF THE INVENTION

1. Field of the Invention

The present invention relates to switched capacitance circuits and, more particularly to a switched capacitance circuit having an analog/digital converter circuit.

2. Description of the Related Art

As is well known, switched capacitance circuits utilize switches, typically MOS (Metal Oxide Semiconductor) transistors, capacitors and operational amplifiers to perform some analog functions that are normally realized by means of resistances, capacitors and operational amplifiers.

Switched capacitance circuit techniques, developed principally for the purpose of rendering possible the simultaneous integration of analog and digital functions in the same integrated circuit, found their most extensive application in the realization of filters and in the realization of circuits for sampling signals and/or converting data.

In particular, applications relating to signal sampling and data conversion make extensive use of switched capacitance circuits that include a switched capacitance section for sampling (i.e., charging onto the capacitances) an input signal and producing a sampled signal on an output terminal and a second section that includes an operational stage, a comparator stage for example, provided with an input terminal connected to the output terminal of the switched capacitance section for receiving the signal that the section has sampled.

Known applications of this type are the switched capacitance analog/digital converters like those that, for example, function in accordance with SAR (Successive Approximation Register) technique, sometimes also referred to by the expression "charge redistribution converters".

FIG. 1 illustrates a simplified schematic layout of a portion of a differential analog/digital converter of the SAR type forming part of the prior art.

The shown converter portion includes a switched capacitance section SC capable of receiving a differential input signal $V_{INP}$, $V_{INM}$ comprising a first $V_{INP}$ and a second $V_{INM}$ signal component. The switched capacitance section SC is also such as to receive a reference signal $V_{REFP}$, $V_{REFM}$ that is likewise differential.

The switched capacitance section SC includes a first array AR of capacitors Ca, Cb, Cc having a first terminal connected to a first common node NS and a second terminal connected to a respective switch Swa, Swb, Swc.

The switched capacitance section SC further includes a second array AR' of capacitors Ca', Cb', Cc' having a first terminal connected to a second common node NS' and a second terminal connected to a respective switch Swa', Swb', Swc'.

Furthermore, the converter portion shown in the figure is also provided with an operational stage, in particular a voltage comparator CMP that, by means of the switches Sw1 and Sw1', can be closed-loop reset.

For the sake of simplicity, the substantially logical part of the analog/digital converter provided for controlling the various switches and functioning in accordance with SAR-type conversion technique has not been shown in FIG. 1.

A delicate phase in the conversion of the analog input signal $V_{INP}$, $V_{INM}$ into a digital signal is (represented by) the sampling phase of that signal. During this phase the first capacitor array AR has the task of sampling the first component $V_{INP}$ of the differential input signal, while the capacitor array AR' has the task of sampling the second component $V_{INM}$ of the differential input signal.

In accordance with the layout of FIG. 1, prior designs make extensive use of a technique intended to closed-loop reset the comparator CMP by means of switches Sw1, Sw1' (during the sampling phase) in order to force the nodes NS, NS' to a low impedance at a respective voltage value optimal for the operation of the comparator CMP.

For example, a switched capacitance circuit including a closed-loop resettable comparator during the sampling phase of the input signal of a type similar to the one cited above is described in greater detail in the European Patent Application published under the number EP 1039642.

It has been observed that the duration of the transient necessary for charging the capacitances of the switched capacitance section SC becomes particularly critical in applications that call for a high conversion frequency. The duration of this transient is significantly influenced by the impedance seen at the summation nodes NS, NS' during the sampling phase. In fact, this impedance, together with the values of the capacitances of the switched capacitance section SC, influences the time constant of the charging transient in a decisive manner. When the duration of this transient has to be reduced, it is typically not possible to act on the capacitances of the switched capacitance section because, as is well known to persons skilled in the art, the values of these capacitances are predetermined and unchangeable, since they are essentially imposed by the resolution of the converter.

With a view to increasing the speed at which the input voltage can be charged onto the capacitors of a switched capacitance circuit that includes a closed loop resettable comparator of the type described above, a possible solution would be constituted by redesigning the comparator CMP in such a manner as to increase the current that the comparator is capable of providing to the summation nodes NS, NS' (for charging the capacitors of the switched capacitance section SC).

It has been observed that this solution is associated with some drawbacks. In particular, the power consumption of the comparator CMP becomes significantly greater when this current is increased. This is due to the fact that all the generators within the comparator have to provide a greater current for the purpose of continuing to assure the biasing and frequency response performances necessary for settling the comparator.

Furthermore, maintenance of the biasing performances (which include maintenance of the common mode voltage of the comparator at the value that makes it possible to optimize the comparator performances) calls for an increase of the aspect ratio W/L of the MOS transistors within the comparator CMP and this determines a considerable increase of the area occupied by the comparator.

Though here described with particular reference to an analog/digital converter, these problems are nevertheless quite generally associated with circuits that provide switched capacitances upstream of a converter stage or, more generally, an operational stage.

BRIEF SUMMARY OF THE INVENTION

The disclosed embodiments of the present invention provide a circuit that obviates the drawbacks and problems of the known technique described above and, more particularly, realize a switched capacitance circuit in which the best performances in terms of input signal sampling speed do not impose an excessive increase of the power consumption or a significant increment of the area occupied by the circuit or both.

In accordance with one embodiment of the invention, a switched capacitance circuit is provided that includes a switched capacitance stage, capable of receiving as input a signal and carrying out a sampling of the signal and having at least one group of capacitors each of which has a terminal connected to a common node, at least one operational stage including at least one input terminal connected to the common node, the operational stage providing a current to the common node for charging the group of capacitors during a sampling time interval of the signal, and an auxiliary circuit connected to the common node and configured for activation and deactivation by an enabling signal for injecting a further current into the common node and for increasing the current provided to the common node during at least one time interval equal to a fraction of the sampling time interval.

In accordance with another aspect of the present invention, the input signal of the foregoing embodiment is a differential signal. More preferably, the at least one group of capacitors includes a first group of capacitors having a respective terminal connected to a first common node and a second group of capacitors having a respective terminal connected to a second common node, the comparator including a differential comparator having a first and a second input terminal connected, respectively, to the first and second common node, and wherein the auxiliary circuit includes a first and a second auxiliary stage connected, respectively, to the first and second common node.

In accordance with another embodiment of the invention, an analog/digital converter is provided that includes a switched capacitance circuit. The switched capacitance circuit is formed to include a switched capacitance stage capable of receiving as input a signal and carrying out a sampling of the signal and including at least one group of capacitors, each of which has a terminal connected to a common node, at least one operational stage including at least one input terminal connected to said common node, the operational stage providing a current to the common node for charging the group of capacitors during a sampling time interval of the signal, and an auxiliary circuit connected to the common node and configured for activation and deactivation by an enabling signal for injecting a further current into the common node and for increasing the current provided to the common node during at least one time interval equal to a fraction of the sampling time interval.

In accordance with yet another embodiment of the invention, a circuit is provided that includes a switched capacitance stage for sampling an input signal, an operational stage having an input terminal coupled to a common node of the switched capacitance stage for injecting a current in the common node, and an auxiliary circuit coupled to the common node and configured to inject an additional current into the common node and increase the current to the common node during at least a portion of the time the operational stage is injecting current into the common node.

In accordance with another aspect of the foregoing embodiment, the operational stage is configured to inject current into the common node during a sampling time interval of the input signal. Ideally, the auxiliary circuit is configured to input the additional current during at least one time interval equal to a fraction of the sampling time interval.

In accordance with still yet another aspect of the foregoing embodiment, the circuit includes a control circuit configured to enable and disable the auxiliary circuit.

BRIEF DESCRIPTION OF THE SEVERAL VIEWS OF THE DRAWINGS

Further characteristics and advantages of the invention will be more readily understood from the following detailed description of a preferred embodiment thereof, which is given by way of example and is therefore not to be understood as being limitative in any way, the description making reference to the attached drawings, of which.

DETAILED DESCRIPTION OF THE INVENTION

Figure 1:
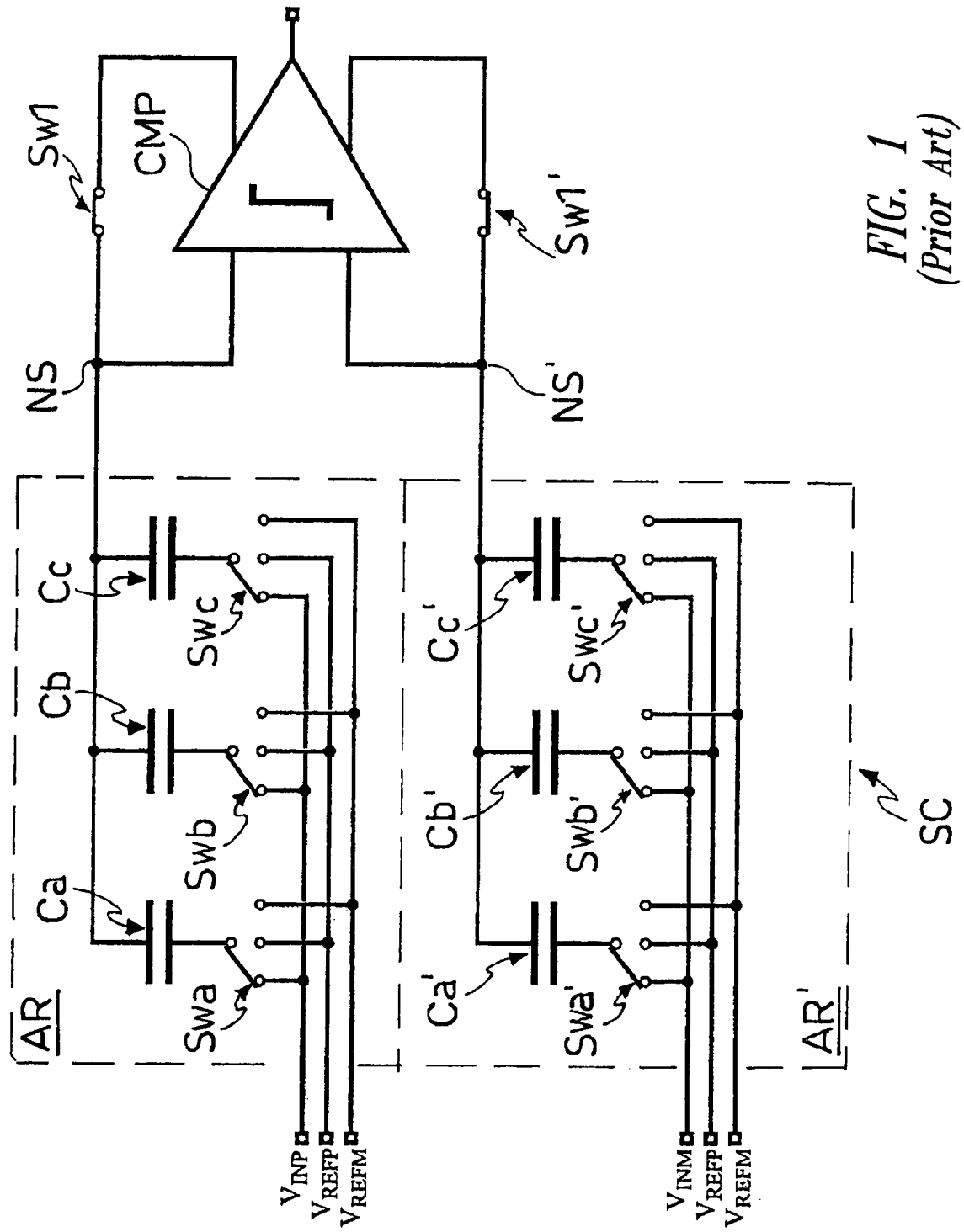
FIG. 1 shows the schematic layout of a portion of an analog/digital converter of the known type.
Figure 2:
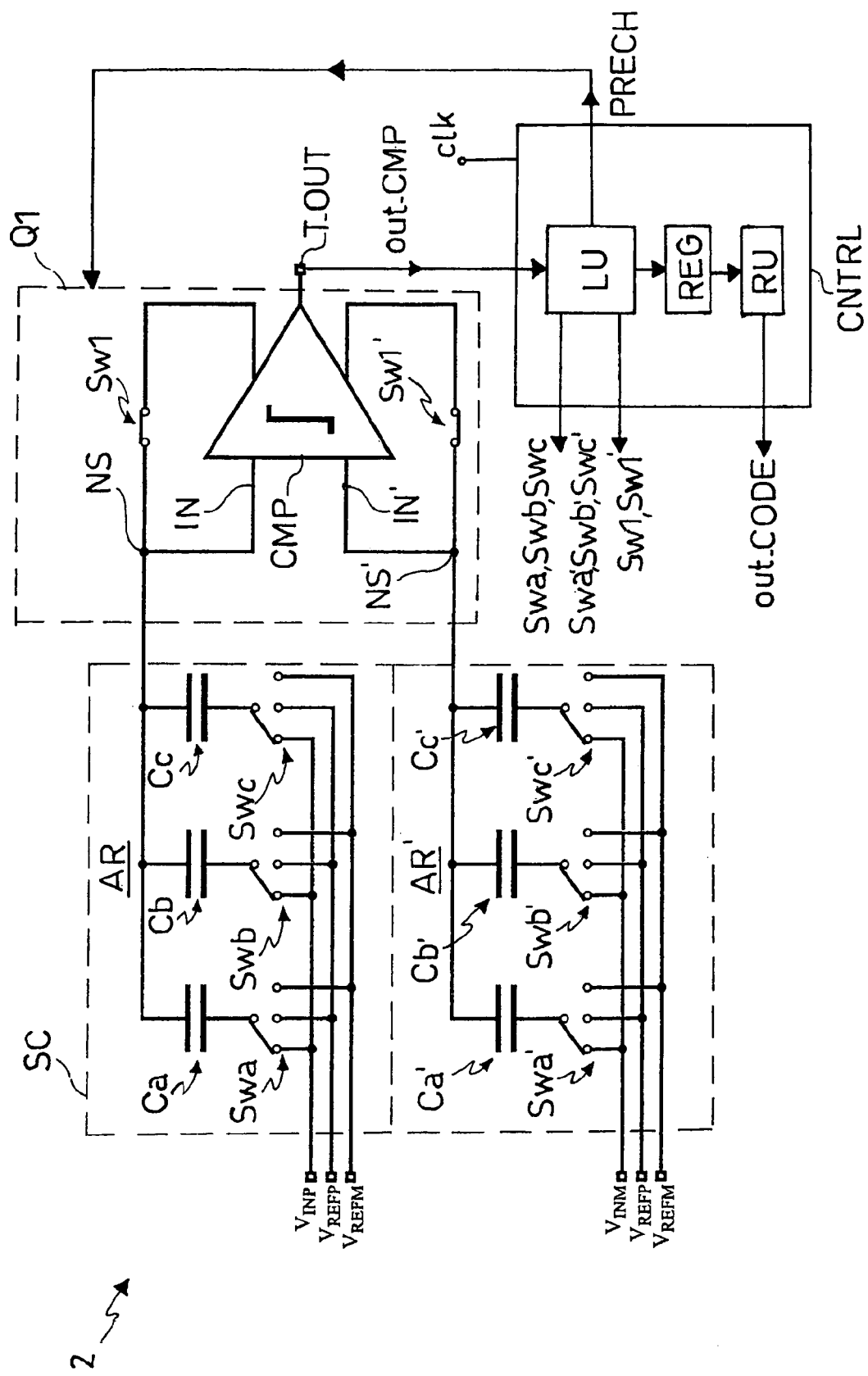
FIG. 2 shows the simplified schematic layout of a switched capacitance circuit in accordance with the present invention.

FIG. 2 shows a simplified schematic circuit layout of a particularly preferred embodiment of a switched capacitance circuit 2 in accordance with the present invention. The switched capacitance circuit 2 includes a switched capacitance section SC, an operational stage CMP, and a control section CNTRL. In this example the operational stage CMP is a voltage comparator comprising a non-inverting input IN, an inverting input terminal IN' and an output terminal T_OUT.

In the embodiment of FIG. 2, the switched capacitance circuit 2 is a three-bit analog/digital converter capable of converting an analog differential input signal $V_{INP}$, $V_{INM}$ into a series of three-bit digital samples out_CODE of that signal. The teachings of the present invention may however be extended without difficulty to analog/digital converters having a greater resolution, for example, ten-bit converters.

Preferably, the analog/digital converter will be a converter of the SAR type and of the "fully differential" type and the analog input signal $V_{INP}$, $V_{INM}$ will be a differential voltage that includes a first component $V_{INP}$ and a second component $V_{INM}$ Nevertheless, the consideration set out in the present description can be extended without difficulty to switched capacitance circuits of a different type, for example, also analog/digital converters that utilize techniques other than the SAR technique or, like the converter described in the aforementioned European Patent EP 1039642 have a "pseudo-differential" structure.

In the example of FIG. 2, the switched capacitance section SC is such as to be capable of receiving the differential input voltage $V_{INP}$, $V_{INM}$ and a differential reference voltage $V_{REFP}$, $V_{REFM}$ comprising two components, respectively $V_{REFP}$, $V_{REFM}$.

The switched capacitance section includes a first group (or array) AR of capacitors Ca, Cb, Cc and, preferably, a second group (or array) AR' of capacitors Ca', Cb', Cc'. The switched capacitance section SC is also provided with a respective group (or array) of switches, respectively Swa, Swb, Swc and Swa', Swb', Swc' for each group of capacitors.

The capacitors Ca, Cb, Cc of the first array AR are respectively provided with a first terminal connected to a first common node NS, or first summation node. The summation node NS is connected to the non-inverting input terminal IN of the comparator CMP. The capacitors Ca, Cb, Cc of the first array AR are respectively provided with a second terminal connected to a respective switch Swa, Swb, Swc.

Similarly, the capacitors Ca', Cb', Cc' of the second array AR' are respectively provided with a first terminal connected to a second common node NS', or second summation node. This node is connected to the inverting input terminal IN' of the comparator CMP. The capacitors Ca', Cb', Cc' of the second array AR' are respectively provided with a second terminal connected to a respective switch Swa', Swb', Swc'.

Two further switches Sw1 and Sw1' are provided for closed-loop resetting the comparator CMP, when the differential voltage $V_{INP}$, $V_{INM}$ is charged onto the capacitors of the two arrays AR, AR', i.e., during the sampling phase of the differential input voltage $V_{INP}$, $V_{INM}$. This makes it possible to force the two summation nodes NS, NS' to a low impedance at a common mode voltage $V_{CM}$, $V_{CM'}$ that depends on the structure of the comparator CMP and the operating conditions and, preferably, optimal for the biasing and the functioning of the comparator CMP.

It should be noted that in practice the switches indicated in the circuit of FIG. 2 comprise electrically-controllable electronic connection/disconnection devices, for example, MOS transistors or combinations of MOS transistors.

The comparator CMP is such as to provide at its output terminal T_OUT a digital comparison signal out_CMP that assumes either a first or a second value on the basis of the result of the comparison between the signals present, respectively, at the non-inverting input IN and the inverting input IN'.

The control section CNTRL is provided with an input for receiving the digital comparison signal out_CMP and further includes an input for receiving a timing signal clk.

The control section CNTRL includes a logic control unit LU, a register REG and a register reading unit RU.

In greater detail, the logic control unit LU is such as to receive the digital comparison signal out_CMP and to output signals capable of controlling the switches Swa, Swb, Swc and Swa', Swb', Swc' of the two arrays and also the switches Sw1 and Sw1' of the comparator CMP. The control of these switches is effected in a accordance with a predetermined algorithm, in this particular example of the "successive approximation" type, i.e., of the SAR type.

Advantageously, the logic section LU will also be such as to output an enabling signal PRECH to enable/disable an auxiliary circuit that will subsequently be described in greater detail. Preferably, the signal PRECH will be a digital signal that can assume a first level such as to enable the auxiliary circuit, for example a "high" logic level, and a second level such as to disable the auxiliary circuit, for example a "low" logic level.

The logic control unit LU is connected to the register REG that makes it possible to memorize the positions of the switches of the switched capacitance section SC.

The register reading unit RU outputs a digital signal out_CODE that corresponds to a digitalized version of the analog signal that is to be converted.

The switched capacitance circuit 2 shown in FIG. 2 corresponds to a configuration of the circuit during the time interval reserved for sampling the differential input signal $V_{INP}$, $V_{INM}$. FIG. 2 in practice therefore represents the configuration assumed by the circuit 2 during a sampling time interval $T_{SAMPLE}$. During this interval the first component $V_{INP}$ will be applied to all the capacitors of the first array AR and the second component $V_{INM}$ will be applied to all the capacitors of the second array AR'.

It should be noted that in a differential analog/digital converter like the one shown in FIG. 2 the switches connected to corresponding capacitors corresponding of two arrays AR, AR' are controlled simultaneously and in such a manner that different components of the input and reference voltages are applied to the corresponding capacitors of the two arrays. For example, if the first component $V_{INP}$ of the differential input voltage is applied to the capacitor Ca, the second component $V_{INM}$ of the differential input voltage will be applied to the capacitor Ca'.

In the configuration of FIG. 2, the switches Sw1 and Sw1' are in a position such as to provide a closed loop reset of the comparator CMP.

Figure 3:
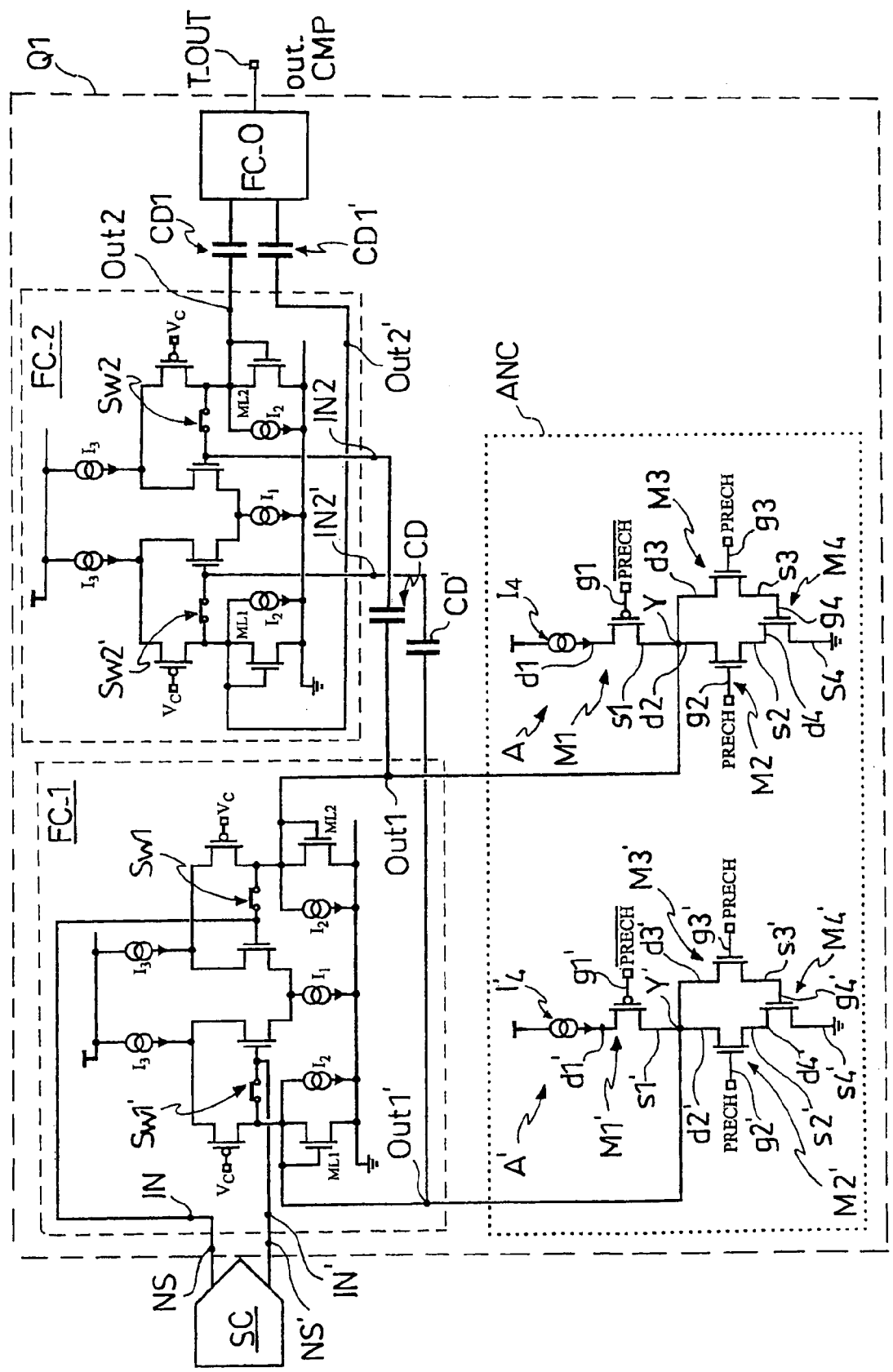
FIG. 3 shows a portion of the schematic circuit layout of FIG. 2 in greater detail.

FIG. 3 shows a portion of the circuit of FIG. 2 in greater detail. More precisely, what is principally represented in FIG. 3 is the portion of the circuit that in FIG. 2 is comprised within the broken-line rectangle indicated by Q1. In practice, therefore, FIG. 3 shows in greater detail the schematic circuit layout of the comparator CMP of FIG. 2, inclusive of the part for providing a closed-loop reset of the comparator CMP. For the sake of simplicity, on the other hand, FIG. 3 shows less detail of the switched capacitance section SC, which in FIG. 3 is represented in the form of the block SC, and, again for the sake of simplicity, the control CNTRL is omitted. Equal or similar elements in FIGS. 2 and 3 are indicated by the same reference numbers.

In accordance with what is shown in FIG. 3, the comparator CMP will preferably, without limitation, be a multistage comparator including: a "folded cascode" operational differential input stage FC_1, an intermediate folded cascode operational stage that is connected in cascade with the operational input stage FC_1.

Furthermore, the comparator CMP will preferably include a third stage FC_OUT that makes it possible to convert the differential output of the intermediate stage FC_2 into a binary digital signal out_CMP. In the example of FIG. 3, the three operational stages FC_1, FC_2 and FC_0 are DC decoupled from each other by means of decoupling capacitances CD, CD' and CD1, CD1'.

The folded cascade stages FC_1, FC_2 are known to persons skilled in the art of the sector even in numerous realization variants and will not therefore be here described in greater detail.

Each of the stages FC_1, FC_2 is provided with biasing current generators $I_1$, $I_2$, $I_3$ and MOS load transistors ML1, ML2. The MOS load transistors ML1, ML2 are connected in a diode configuration and, more particularly, each one of these transistors is provided with a control terminal connected to a first conduction terminal and is provided with a second conduction terminal connected to ground.

In the circuit shown in FIG. 3, each of the differential stages FC_1, FC_2 is provided with two switches, respectively, SW1, SW1' and SW2, SW2'. In practice the switches SW1 and SW1' of FIG. 3 coincide with the switches indicated in FIG. 2 by means of the same reference symbols.

The configuration shown in FIG. 3 represents the various stages of the comparator CMP in the closed-loop reset configuration. Given the closed state of the switches SW1, SW1' and SW2, SW2', each of the differential stages FC_1, FC_2 therefore has its input terminals, which are respectively non-inverting and inverting, short-circuited to its output terminals, which are respectively inverting and non-inverting. In the example of FIG. 3, more particularly, the first operational stage FC_1 includes two input terminals IN and IN' (in this example coincident with the input terminals of the comparator CMP) and two output terminals Out1 and Out1'. When in the closed-loop reset configuration as shown in FIG. 3, each of the input terminals IN, IN' is short-circuited to a respective output terminal Out1, Out1' through the switches SW1 and SW1'.

Similarly, the second operational stage F2 of the comparator CMP includes two input terminals IN2 and IN2' and two output terminals Out2 and Out2'. When in the closed-loop reset configuration as shown in FIG. 3, each of the input terminals IN2, IN2' is short-circuited to a respective output terminal Out2, Out2' through the switches SW2 and SW2'. It should be noted that the nodes NS and NS' could be forced to a low impedance by doing no more than closed loop resetting the first stage FC_1 of the comparator CMP. Nevertheless, it is advisable to reset also the second stage FC_2 of the comparator CMP, because this will make it possible to cause the inputs IN, IN' of the comparator CMP to memorize the offset of the comparator. In practice, therefore, one could make provision for the signals supplied by the control section CNTRL to control the switches Sw1, Sw1' to simultaneously control also the switches Sw2, Sw2'.

As can be seen in FIG. 3, the switched capacitance circuit further includes—and advantageously so—an auxiliary circuit ANC connected either directly or indirectly to each common node NS, NS' of the switched capacitance section SC. Preferably, the auxiliary circuit ANC will include, associated with each common node NS, NS' of the switched capacitance section SC, an auxiliary stage A, A' that is either directly or indirectly connected with it.

In the example of FIG. 3, which corresponds to a particularly preferred embodiment, each of the auxiliary stages A, A' includes an output terminal Y, Y' that can be connected through the switch Sw1, Sw1' to the respective common node NS, NS' of the switched capacitance section SC.

In greater detail, the output terminals Y, Y' of the auxiliary stages A, A' are connected to a respective output terminal Out1, Out1' of the first operational stage FC_1 of the comparator CMP, so that they will be directly connected to the respective common nodes NS, NS' of the switched capacitance section SC when the comparator CMP is in the closed-loop reset configuration. This particularly preferred embodiment has the advantage of leaving the summation nodes NS, NS' associated only with the diffusions of the switches Sw1, Sw1' when the switches Sw1, Sw1' are in the open state.

Advantageously, each auxiliary stage A, A' will be such as to supply to the common node NS, NS' associated with it a current useful for charging the array of capacitances AR, AR' connected to said common node NS, NS'.

In the particular embodiment described with reference to FIGS. 2 and 3, the auxiliary circuit ANC has been represented, without limitation, as included in the comparator CMP. Alternatively, the auxiliary circuit ANC may be indifferently realized as being either partially included in the comparator CMP or even external to it.

In a particularly preferred embodiment, each of the auxiliary stages A, A' can be activated/deactivated by the enabling signal PRECH to inject into the common node NS, NS' associated with it a current capable of increasing the current supplied to said node NS, NS' during the sampling interval of differential input signal $V_{INP}$, $V_{INM}$, this for the purpose of obtaining a more rapid charging of the capacitor arrays AR, AR'.

In a particularly preferred embodiment, the enabling signal PRECH is such as to enable the auxiliary stages A, A' for the entire duration of the time interval equal to a predetermined fraction of the sampling interval $T_{SAMPLE}$. More preferably, said predetermined fraction will include an initial portion of the sampling interval $T_{SAMPLE}$.

In the particular example described with reference to FIG. 3, each of the auxiliary stages A, A' will include a respective current generator $I_4$, $I_{4'}$ connected in series by means of at least a first electronic switch M1, M1' to a load element M4, M4'.

In a particular preferred embodiment, the current generator $I_4$, $I_4'$ of each auxiliary stage A, A' will be connected in series with a first conduction terminal d1, d1' of the first electronic switch M1, M1'.

The first electronic switch M1, M1' further includes a control terminal g1, g1' for being controlled by means of a control signal $\overline{PRECH}$. More preferably, the first electronic switch M1, M1' will include a transistor of the P-MOS type and the control signal $\overline{PRECH}$ is the negated signal of the enabling signal PRECH.

Preferably, each auxiliary stage A, A' will include a second electronic switch M2, M2' connected in series between the first electronic switch M1, M1' and the load element M4, M4'. In a particularly preferred embodiment, the second electronic switch M2, M2' will be a transistor of the N-MOS type controllable by means of the enabling signal PRECH.

Preferably, the load element M4, M4' will include a load transistor M4, M4' of the N-MOS type that can be controlled by means of a third electronic switch M3, M3' included in each auxiliary stage A, A' and which, in the preferred embodiment of FIG. 3, is a transistor of the N-MOS type having a first conduction terminal s3, s3' connected to a control terminal g4, g4' of the load transistor M4, M4' and a second conduction terminal d3, d3' connected to a common node Y, Y' (in this particular example coincident with the output terminal Y, Y' of the auxiliary stage A, A') to a conduction terminal d2, d2' of the transistor M2, M2' and to conduction terminal s1, s1' of the transistor M1, M1'.

Preferably, the transistor M3, M3' will include a control terminal g3, g3' for being controlled by the enabling signal PRECH.

In a particularly advantageous embodiment, the auxiliary circuit ANC is dimensioned in such a manner that:

the MOS load transistors M4, M4' of the auxiliary stages A, A' are a replica of, respectively, the load diodes ML2, ML1 of the comparator CMP and are characterized by having an aspect ratio W/L that is N times greater than that of the diodes (where N is a real number greater than 1);

the current generators I4, I4' of the auxiliary circuits A, A' are dimensioned in such a manner as to generate a current that has an intensity equal to N times the intensity of the current $I_L$ that is supplied by the comparator CMP and flows in the load diodes ML1, ML2 of the comparator CMP in the absence of the auxiliary circuit ANC (or whenever this circuit is disabled) and in closed-loop rest configuration of the comparator CMP.

Since in the circuit of FIG. 3 this current $I_L$ is given by:

$$I_L = I_3 - I_2 - \frac{I_1}{2}$$

we shall therefore have:

$$I_4 = I'_4 = N\left(I_3 - I_2 - \frac{I_1}{2}\right).$$

The particular dimensioning that has just been described makes it possible, when the auxiliary circuit is enabled by the signal PRECH, for the common nodes NS and NS' to be advantageously forced to a voltage $V_A$, $V_A'$ having a value approximately equal to the common mode voltage $V_{CM}$, $V_{CM}'$ to which the nodes NS, NS' of the comparator CMP would be forced if the auxiliary circuit ANC were disabled or lacking.

There will now be described the operation of the switched capacitance circuit 2, which—as already explained—in the particular example illustrated in FIGS. 2 and 3 constitutes an analog/digital converter of the SAR type, i.e., a successive approximations converter.

For the sake of simplicity, from this description there will be omitted the description of the detailed functioning of the analog/digital converter during the various attempts (i.e., the successive approximation steps), because this forms part of the prior art and is therefore well known to a person skilled in the art.

On the other hand, the description will dwell in a more detailed manner on the functioning of the converter of FIGS. 2 and 3 during the phases of closed-loop resetting of the converter CMP and sampling the differential input voltage, which are preparatory for the subsequent conversion of this voltage into a digital code OUT_CODE.

In particular, it is proposed to explain the operation of the converter within the limits of a single sampling interval $T_{SAMPLE}$ of the differential input voltage.

When the differential input voltage is to be sampled, the control section CNTRL and, more particularly, the logic unit LU carry out the following operations:

generating control signals for the switches Swa, Swb Swc associated with the first array AR of capacitors Ca, Cb, Cc to bring said switches Swa, Swb, Swc into a configuration such as to connect the corresponding capacitors to the first component $V_{INP}$ of the differential input voltage;

generating control signals for the switches Swa', Swb' Swc' associated with the second array AR' of capacitors Ca', Cb', Cc' to bring said switches Swa', Swb', Swc' into a configuration such as to connect the corresponding capacitors to the second component $V_{INM}$ of the differential input voltage;

generating control signals for the switches Sw1, Sw1' of the comparator CMP for the purpose of closed loop resetting the comparator CMP;

generating an enabling signal PRECH having a level such as to enable the auxiliary circuit ANC (in the particular example here described, the signal PRECH will assume a "high" logic level such as to bring the MOS transistors M2, M3 and M2', M3' into conduction and its negated signal will assume a "low" logic level such as to bring the MOS transistors M1 and M1' into conduction).

In a particularly preferred embodiment, all the aforesaid operations are carried out in such a manner as to be substantially simultaneous with each other and synchronized with the beginning of the sampling interval $T_{SAMPLE}$.

Following the enabling effected by means of the signal PRECH, the first auxiliary stage A will force the common node NS to a voltage $V_A$ and the second auxiliary stage A' will force the common node NS' to a voltage $V_A'$. The value of the voltages $V_A$ and $V_A'$ is determined, respectively, by the voltage drop across the load transistors M4 and M4' produced by the currents I4 and I4'.

Each of the capacitors of the first array AR will therefore be affected by a charging transient such as to establish a voltage difference $V_{INP}-V_A$ between its plates. Similarly, each of the capacitors of the second array AR' will be affected by a charging transient such as to establish a voltage difference $V_{INM}-V_A'$ between its plates.

Advantageously, during the charging transient of the capacitors the auxiliary circuit enabled by the signal PRECH will supply to the common nodes NS, NS' a current about N times greater than the current that the comparator CMP would provide for them if the auxiliary circuit ANC were lacking (or in a disabled state). Consequently, the fact that the enabling of the auxiliary circuit ANC supplies a greater current to the common nodes NS, NS' makes it possible, and advantageously so, to reduce the duration of the charging transient of the capacitors of the switched capacitance section SC.

The reduction of the transient duration can also be explained in a manner that is alternative but equivalent to the one given above by reasoning in terms of the impedance of the common nodes NS, NS' rather than in terms of current.

Indeed, when the auxiliary circuit ANC is enabled and the comparator CMP is in the closed-loop reset configuration, the impedance at the nodes NS and NS' is reduced by a factor N as compared with the impedance to which these nodes can be forced by means of the mere closed loop resetting of the comparator CMP (that is to say, in a condition in which the auxiliary circuit is either disabled or lacking). This is due to the fact that the load transistors M4 and M4' of the auxiliary circuit ANC in the preferred embodiment of FIG. 3 have, respectively, an aspect ratio W/L that is about N times greater than the aspect ratio of the load diodes ML2 and ML1 of the comparator CMP.

It should be noted that a reduction of the impedance of the common nodes NS' NS' implies a corresponding and almost linear reduction of the time constant of the charging transient of the capacitors included in the switched capacitance section SC.

It should also be noted that the increase of the current supplied to the summation nodes NS, NS' (or, similarly, the reduction of the impedance existing at the summation nodes NS, NS') is obtained by maintaining the voltage of the summation nodes NS, NS' approximately unchanged.

Coming back to the description of the functioning of the circuit of FIG. 3, the control section CNTRL in a particularly preferred embodiment, following the lapse of a predetermined interval (preferably having the value of an integral multiple of cycles of the clock signal clk) starting at the instant when the auxiliary circuit ANC becomes enabled, disables this circuit by means of the signal PRECH, thus leaving the comparator CMP alone in completing the charging of the capacitor arrays AR, AR' of the switched capacitance section SC during the remaining and final part of the sampling interval $T_{SAMPLE}$.

Advantageously, the duration of the enabling interval of the auxiliary circuit ANC will be selected in such a manner that the comparator CMP has at its disposal a residual fraction of the sampling interval $T_{SAMPLE}$ sufficiently long to bring the common nodes NS and NS' back from respectively, the voltages VA and VA' (forced by the auxiliary circuit ANC) to their intrinsic common mode voltages $V_{CM}$ and $V_{CM}'$. In fact, this condition represents the best situation for guaranteeing the greatest accuracy of the subsequent phase of comparing the voltages at the inputs IN and IN' of the comparator CMP. In fact, it should be observed that, also if the manufacturing process of the comparator CMP and the auxiliary circuit ANC is a very accurate process, a certain, albeit minimal, mismatching will be statistically possible between the design and the effective realization, so that it is therefore probable that the voltages $V_A$ and $V_A'$ will have values that do not exactly coincide with the common mode voltages $V_{CM}$ and $V_{CM}'$ of the comparator CMP.

Once such necessary residual interval has been estimated statistically and in a conservative manner, the factor N can be determined as the smallest number capable of assuring that the first part of the transient (i.e., the one in which the auxiliary circuit ANC is enabled) will be sufficiently fast to arrive at steady conditions in such a manner as to assure that the second part of the transient will become correctly exhausted.

On the basis of what has been described above, it should be noted that the role of the auxiliary circuit ANC is that of pre-charging the switched capacitance section SC in such a manner that, following said pre-charging, the remaining part of the charging can be correctly carried out by the comparator CMP within the sampling interval $T_{SAMPLE}$.

It should be noted that, advantageously, the auxiliary circuit (or pre-charging circuit) ANC contributes to the power consumption of the converter only for a very limited period of time and, consequently, adds only a negligible power consumption because this additional consumption is averaged over the entire conversion time.

Advantageously, the addition of the auxiliary circuit ANC causes only a very modest increase of the area occupied by the circuit. In fact, only the load transistors M4, M4' have an aspect ratio (W/L) N times greater than the aspect ratio of the load diodes ML2, ML1 of the comparator and only the two current generators I4 and I4' have an aspect ratio W/L substantially proportional to N. It is not therefore necessary to increase the dimensions of all the MOS transistors of the comparator.

Furthermore, since the comparator CMP has sufficient time in the final part of the sampling interval to bring the nodes NS and NS' back to their common mode voltage by its own unassisted action, it is not necessary for the nodes NS and NS' to be forced during the enabling of the auxiliary circuit ANC to a voltage exactly equal to the common mode voltage imposed by the comparator. This implies that the MOS load transistors M4, M4', which ideally ought to be a replica of the load diodes ML1, ML2, may also be realized with a certain degree of imprecision, that is to say, a certain mismatching, and therefore do not call for an excessive area occupation also on account of the high factors N (which, for example, may be equal to 20).

Advantageously, the use of switches appropriately positioned in the auxiliary circuit ANC, for example as shown in FIG. 3, renders the influence of said auxiliary circuit ANC altogether negligible during the normal operation of the converter.

In fact, it has already been said that, preferably, the MOS load transistors M4 and M4' of the auxiliary circuit ANC will have an aspect ratio W/L N times greater than, respectively, the aspect ratios of the load diodes ML2, ML1 of the first stage FC_1 of the comparator CMP. This implies that when the N factors have high values, the MOS load transistor M4 and M4' of the auxiliary circuit ANC may occupy a non-negligible area and therefore have high drain and gate capacitances. Advantageously, thanks to the MOS transistors M2, M2' and M3, M3', the common nodes NS, NS' are prevented from seeing the drain and gate capacities of the MOS transistors M4 and M4'.

Advantageously, the opening of the electronic switches comprising the MOS transistors M1 and M1' also makes it possible to avoid having the current generators I4 and I4' of the auxiliary circuit ANC continue charging the common nodes NS, NS' (or, in the particular example of FIG. 3, the outputs Out, Out' of the first operational stage FC_1) when this is not necessary and also makes it possible to decouple from the common nodes NS and NS' the drain capacitances of the current generators I4 and I4', which normally have high values. In fact, it may well be convenient to dimension these generators with a large area in order to reduce the mirroring error.

On the basis of what has been explained hereinabove, it is preferable to dimension the MOS transistors M1, M1', M2, M2' and M3, M3' with an aspect ratio W/L and an area W*L such that the transistors will prove to be sufficiently conductive when the auxiliary circuit ANC is enabled, though without thereby increasing in a significant manner the capacitance associated with the common nodes NS and NS' when the auxiliary circuit is disabled.

Obviously, a person skilled in the art, when having to satisfy contingent and specific needs, will be able to introduce further modifications and variants into the switched capacitance circuit and the analog/digital converter in accordance with the invention, though without thereby overstepping the protection limits of the invention as defined in the claims hereinbelow.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A switched capacitance circuit comprising:
   a switched capacitance stage capable of receiving as input a signal and carrying out a sampling of said signal and comprising at least one group of capacitors each of which has a terminal connected to a common node;
   at least one operational stage including at least one input terminal connected to said common node, the operational stage providing a current to said common node for charging said group of capacitors during a sampling time interval of said signal; and
   an auxiliary circuit connected to said common node and configured for activation and deactivation by an enabling signal, the auxiliary circuit, when activated, injecting a further current into said common node for increasing the current provided to said common node during at least one time interval equal to a fraction of said sampling time interval in order to reduce a charging transient of the at least one group of capacitors.

2. The switched capacitance circuit of claim 1 wherein said fraction includes an initial portion of said sampling interval.

3. The switched capacitance circuit of claim 1 wherein said enabling signal is such as to deactivate said auxiliary circuit before the end of said sampling interval.

4. The switched capacitance circuit of claim 1 wherein, when said auxiliary circuit is activated, said common node:
   presents an impedance substantially reduced as compared with the impedance assumed by said node when the auxiliary circuit is deactivated; and
   is forced to a voltage having a value approximately equal to the voltage to which said node is forced when the auxiliary circuit is deactivated.

5. The switched capacitance circuit of claim 1 wherein said auxiliary circuit includes at least one auxiliary stage comprising a current generator and a load element in series with said current generator.

6. The switched capacitance circuit of claim 5 wherein said auxiliary circuit includes a first electronic switch connected in series between said current generator and said load element, including a control terminal for being controlled by said enabling signal.

7. The switched capacitance circuit of claim 6 wherein said auxiliary circuit further includes a second electronic switch connected in series between said first switch and said load element, including a control terminal for receiving said enabling signal.

8. The switched capacitance circuit of claim 1 wherein said operational stage comprises a voltage comparator that may assume a closed-loop reset configuration, and wherein said comparator is in said closed-loop reset configuration during said sampling interval.

9. The switched capacitance circuit of claim 8 wherein said comparator includes at least a first stage including an output terminal connected to an output terminal of said auxiliary circuit, the auxiliary circuit directly connected to said common node when the comparator is in said closed-loop reset configuration.

10. The switched capacitance circuit of claim 9 wherein:
said input signal is a differential signal;
said at least one group of capacitors includes a first group of capacitors having a respective terminal connected to a first common node and includes a second group of capacitors having a respective terminal connected to a second common node;
said comparator comprising a differential comparator having a first and a second input terminal connected, respectively, to said first and said second common node;
and wherein said auxiliary circuit includes a first and a second auxiliary stage connected, respectively, to said first and said second common node.

11. The switched capacitance circuit of claim 10 wherein said comparator includes a first and a second load diode, and wherein said first and second auxiliary stage comprise, respectively, a first and a second load element having a respective aspect ratio approximately N times greater than the one of said first and said second load diode, where N is number greater than 1.

12. The switched capacitance circuit of claim 10 wherein said comparator includes biasing generators for supplying said current to said first and second common node and wherein said first and said second auxiliary stages include a respective current generator for supplying to said first and said second common node a respective current N times greater than said current provided by the comparator, the first and the second auxiliary stage supplying said respective current to said common nodes when said auxiliary circuit is enabled.

13. An analog/digital converter comprising a switched capacitance circuit, comprising:
a switched capacitance stage, adapted to receive as input a signal and carrying out a sampling of the signal and comprising at least one group of capacitors each of which has a terminal connected to a common node;
at least one operational stage including at least one input terminal connected to the common node, the operational stage providing a current to the common node for charging the group of capacitors during a sampling time interval of the signal; and
an auxiliary circuit connected to the common node and configured for activation and deactivation by an enabling signal, the auxiliary circuit, when activated, injecting a further current into the common node for increasing the current provided to the common node during at least one time interval equal to a fraction of said sampling time interval in order to reduce a charging transient of the at least one group of capacitors.

14. The switched capacitance circuit of claim 13 wherein the fraction includes an initial portion of the sampling interval.

15. The switched capacitance circuit of claim 13 wherein the enabling signal is such as to deactivate said auxiliary circuit before the end of the sampling interval.

16. The switched capacitance circuit of claim 13 wherein, when the auxiliary circuit is activated, the common node:
presents an impedance substantially reduced as compared with the impedance assumed by the node when the auxiliary circuit is deactivated; and
is forced to a voltage having a value approximately equal to the voltage to which the node is forced when the auxiliary circuit is deactivated.

17. The switched capacitance circuit of claim 13 wherein the auxiliary circuit includes at least one auxiliary stage comprising a current generator and a load element in series with the current generator.

18. The switched capacitance circuit of claim 17 wherein the auxiliary circuit includes a first electronic switch connected in series between the current generator and the load element, including a control terminal for being controlled by the enabling signal.

19. The switched capacitance circuit of claim 18 wherein the auxiliary circuit further includes a second electronic switch connected in series between the first switch and the load element, including a control terminal for receiving the enabling signal.

20. The switched capacitance circuit of claim 13 wherein the operational stage comprises a voltage comparator that may assume a closed-loop reset configuration, and wherein the comparator is in the closed-loop reset configuration during the sampling interval.

21. The switched capacitance circuit of claim 20 wherein the comparator includes at least a first stage including an output terminal connected to an output terminal of the auxiliary circuit, the auxiliary circuit directly connected to the common node when the comparator is in the closed-loop reset configuration.

22. The switched capacitance circuit of claim 21 wherein:
the input signal is a differential signal;
the at least one group of capacitors includes a first group of capacitors having a respective terminal connected to a first common node and includes a second group of capacitors having a respective terminal connected to a second common node;
the comparator comprising a differential comparator having a first and a second input terminals connected, respectively, to the first and second common node;
and wherein the auxiliary circuit includes first and second auxiliary stages connected, respectively, to the first and second common node.

23. The switched capacitance circuit of claim 22 wherein the comparator includes first and second load diodes, and wherein the first and second auxiliary stages comprise, respectively, first and second load elements having a respective aspect ratio approximately N times greater than the one of the first and second load diodes, where N is number greater than 1.

24. The switched capacitance circuit of claim 22 wherein the comparator includes biasing generators for supplying the current to the first and second common node and wherein the first and second auxiliary stages include a respective current generator for supplying to the first and second common nodes a respective current N times greater than the current provided by the comparator, the first and second auxiliary stages supplying the respective current to the common nodes when the auxiliary circuit is enabled.

25. The analog/digital converter of claim 24, further including a control section capable of generating signals for controlling the switched capacitance section in accordance with a conversion technique of the successive approximation type.

26. A circuit, comprising:
a switched capacitance stage for sampling an input signal;
an operational stage having an input terminal coupled to a common node of the switched capacitance stage for injecting a current in the common node; and
an auxiliary circuit coupled to the common node and configured to inject an additional current into the common node and increase the current to the common node during at least a portion of a sampling time during which the operational stage is injecting current into the common node in order to reduce a charging transient of the at least one group of capacitors.

27. The circuit of claim 26 wherein the operational stage is configured to inject current into the common node during a sampling time interval of the input signal by the switched capacitance stage.

28. The circuit of claim 27 wherein the auxiliary circuit is configured to input the additional current during at least one time interval equal to a fraction of the sampling time interval.

29. The circuit of claim 27, comprising a control circuit configured to generate signals for controlling the switched capacitance stage in accordance with a conversion technique of the successive approximation type.

30. The circuit of claim 28 wherein the auxiliary circuit comprises at least one auxiliary stage having a current generator and a load element in series with the current generator, and further comprising a first electronic switch connected in series between the current generator and the load element and including a control terminal configured to receive an enabling signal.

31. The circuit of claim 30 wherein the auxiliary circuit further includes a second electronic switch connected in series between the first electronic switch and the load element and including a control terminal for receiving the enabling signal.

32. The circuit of claim 31 wherein the operational stage compnses a voltage comparator configured to assume a closed-loop reset configuration, and wherein the comparator is in a closed-loop reset configuration during the sampling interval, the comparator comprising at least a first stage including an output terminal connected to an output terminal of the auxiliary circuit, the auxiliary circuit directly connected to the common node when the comparator is in the closed-loop reset configuration.

33. The circuit of claim 26 wherein:
the input signal is a differential signal;
the at least one group of capacitors includes a first group of capacitors having a respective terminal connected to a first common node and includes a second group of capacitors having a respective terminal connected to a second common node;

the comparator comprising a differential comparator having first and second input terminals connected, respectively, to the first and second common nodes;
and wherein the auxiliary circuit includes first and second auxiliary stages connected, respectively, to the first and second common nodes.

34. The circuit of claim 33 wherein the comparator includes first and second load diodes, and wherein the first and second auxiliary stages comprise, respectively, first and second load elements having a respective aspect ratio approximately N times greater than the one of the first and second load diodes, where N is number greater than 1.

35. The circuit of claim 34 wherein the comparator includes biasing generators for supplying the current to the first and second common nodes and wherein the first and second auxiliary stages include a respective current generator for supplying to the first and second common nodes a respective current N times greater than the current provided by the comparator, the first and second auxiliary stages supplying the respective current to the common nodes when the auxiliary circuit is enabled.

36. A switched capacitance circuit comprising:
a switched capacitance stage capable of receiving as input a signal and carrying out a sampling of said signal and comprising at least one group of capacitors each of which has a terminal connected to a common node;
at least one operational stage including at least one input terminal connected to said common node, the operational stage providing a current to said common node for charging said group of capacitors during a sampling time interval of said signal; and
an auxiliary circuit connected to said common node and configured for activation and deactivation by an enabling signal for injecting a further current into said common node and for increasing the current provided to said common node during at least one time interval equal to a fraction of said sampling time interval, the auxiliary circuit including at least one auxiliary stage comprising a current generator and a load element in series with the current generator.

37. The circuit of claim 36 wherein said auxiliary circuit includes a first electronic switch connected in series between said current generator and said load element, including a control terminal for being controlled by said enabling signal.

38. The circuit of claim 37 wherein said auxiliary circuit further includes a second electronic switch connected in series between said first switch and said load element, including a control terminal for receiving said enabling signal.

39. An analog/digital converter comprising a switched capacitance circuit, comprising:
a switched capacitance stage, adapted to receive as input a signal and carrying out a sampling of the signal and comprising at least one group of capacitors each of which has a terminal connected to a common node;
at least one operational stage including at least one input terminal connected to the common node, the operational stage providing a current to the common node for charging the group of capacitors during a sampling time interval of the signal; and
an auxiliary circuit connected to the common node and configured for activation and deactivation by an enabling signal for injecting a further current into the common node and for increasing the current provided to the common node during at least one time interval equal to a fraction of said sampling time interval, wherein the auxiliary circuit includes at least one auxiliary stage comprising a current generator and a load element in series with the current generator.

40. The circuit of claim 39 wherein the auxiliary circuit includes a first electronic switch connected in series between the current generator and the load element, including a control terminal for being controlled by the enabling signal.

41. The circuit of claim 40 wherein the auxiliary circuit further includes a second electronic switch connected in series between the first switch and the load element, including a control terminal for receiving the enabling signal.

42. A circuit, comprising:
a switched capacitance stage for sampling an input signal;
an operational stage having an input terminal coupled to a common node of the switched capacitance stage for injecting a current in the common node; and
an auxiliary circuit coupled to the common node and configured to inject an additional current into the common node and increase the current to the common node during at least a portion of the time the operational stage is injecting current into the common node;
wherein the input signal is a differential signal;
the at least one group of capacitors includes a first group of capacitors having a respective terminal connected to a first common node and includes a second group of capacitors having a respective terminal connected to a second common node;

the comparator comprising a differential comparator having first and second input terminals connected, respectively, to the first and second common nodes;

and wherein the auxiliary circuit includes first and second auxiliary stages connected, respectively, to the first and second common nodes; and wherein the comparator includes first and second load diodes, and wherein the first and second auxiliary stages comprise, respectively, first and second load elements having a respective aspect ratio approximately N times greater than the one of the first and second load diodes, where N is number greater than 1.

43. The circuit of claim 42 wherein the comparator includes biasing generators for supplying the current to the first and second common nodes and wherein the first and second auxiliary stages include a respective current generator for supplying to the first and second common nodes a respective current N times greater than the current provided by the comparator, the first and second auxiliary stages supplying the respective current to the common nodes when the auxiliary circuit is enabled.

* * * * *